United States Patent
Olson et al.

(10) Patent No.: US 10,620,242 B2
(45) Date of Patent: *Apr. 14, 2020

(54) WATTHOUR METER BLOCK WITH SAFETY SHIELD

(71) Applicant: E.J. Brooks Company, Farmington Hills, MI (US)

(72) Inventors: Justin A. Olson, Flat Rock, MI (US); Allen V. Pruehs, Howell, MI (US); Jeffrey John Hanft, Commerce Township, MI (US); Derrick G. Titus, Farmington, MI (US)

(73) Assignee: E.J. Brooks Company, Farmington Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/864,210

(22) Filed: Jan. 8, 2018

(65) Prior Publication Data

US 2018/0196093 A1 Jul. 12, 2018

Related U.S. Application Data

(63) Continuation-in-part of application No. 15/401,845, filed on Jan. 9, 2017, now Pat. No. 10,020,627.

(51) Int. Cl.
*G01R 21/00* (2006.01)
*G01R 22/06* (2006.01)
*G01R 11/04* (2006.01)

(52) U.S. Cl.
CPC ............ *G01R 21/007* (2013.01); *G01R 11/04* (2013.01); *G01R 22/065* (2013.01)

(58) Field of Classification Search
CPC .... H01R 13/447; H01R 33/74; G01R 21/007; G01R 11/04; G01R 22/065
USPC .................................. 439/146, 517; 361/659
See application file for complete search history.

(56) References Cited

U.S. PATENT DOCUMENTS

| | | | |
|---|---|---|---|
| 5,006,076 A | 4/1991 | Robinson et al. | |
| 5,207,595 A * | 5/1993 | Learmont | G01R 11/04 361/669 |
| 5,571,031 A * | 11/1996 | Robinson | G01R 11/04 439/508 |
| 5,577,933 A * | 11/1996 | Robinson | G01R 11/04 439/508 |
| 5,595,506 A * | 1/1997 | Robinson | H01R 33/94 439/508 |
| D378,806 S | 4/1997 | Phelps, III | |
| 6,059,605 A * | 5/2000 | Robinson | G01R 11/04 439/146 |
| 6,325,666 B1 | 12/2001 | Robinson et al. | |
| 6,478,589 B2 | 11/2002 | Robinson et al. | |
| 6,488,535 B1 * | 12/2002 | Robinson | G01R 11/04 439/508 |

(Continued)

OTHER PUBLICATIONS

Restriction Requirement for U.S. Appl. No. 29/655,333 dated Jun. 28, 2019 (7 pages).

*Primary Examiner* — Travis S Chambers
(74) *Attorney, Agent, or Firm* — Bejin Bieneman PLC

(57) ABSTRACT

A watthour meter block having a safety shield is shown. The safety shield surrounds and isolates electrical components, for example watthour meter block jaws and wires in the watthour meter block. The watthour meter block is pre-wired to allow connection between a watthour meter block and a test switch assembly.

20 Claims, 8 Drawing Sheets

(56) References Cited

U.S. PATENT DOCUMENTS

| | | | |
|---|---|---|---|
| 6,589,072 B2* | 7/2003 | Robinson | G01R 11/04 |
| | | | 439/517 |
| 6,975,504 B2 | 12/2005 | Robinson et al. | |
| 7,315,442 B2 | 1/2008 | Robinson | |
| 7,458,846 B2 | 12/2008 | Loehr et al. | |
| 7,479,029 B2* | 1/2009 | Cook | G01R 11/04 |
| | | | 361/664 |
| 8,002,578 B2* | 8/2011 | Robinson | G01R 11/04 |
| | | | 439/146 |
| 8,547,686 B2* | 10/2013 | Pruehs | H02B 1/03 |
| | | | 361/659 |
| 9,146,258 B2 | 9/2015 | Rudaitis et al. | |
| 2002/0123265 A1* | 9/2002 | Robinson | G01R 11/04 |
| | | | 439/517 |
| 2007/0117436 A1* | 5/2007 | Davis | G01R 11/04 |
| | | | 439/188 |
| 2010/0267277 A1* | 10/2010 | Robinson | G01R 11/04 |
| | | | 439/517 |
| 2013/0328545 A1* | 12/2013 | Rudaitis | G01R 11/04 |
| | | | 324/110 |

* cited by examiner

WATTHOUR METER BLOCK WITH SAFETY SHIELD

CROSS-REFERENCE TO RELATED APPLICATIONS

This patent application is a continuation-in-part of and claims priority to and all advantages of U.S. patent application Ser. No. 15/401,845 filed on Jan. 9, 2017, issued as U.S. Pat. No. 10,020,627 on Jul. 10, 2018, which is herein incorporated by reference in its entirety.

FIELD OF THE INVENTION

The present invention relates to watthour meter sockets and in particular to a watthour meter block safety shield for such watthour meter sockets.

BACKGROUND

Watthour meters used in certain settings may be tested by using test switches. The watthour meter is used to monitor the amount of power being used by a facility and the test switch provides hardware to allow a temporary connection to a portable testing device to test the accuracy of the watthour meter, or a particular connection within the watthour meter. A prior art transformer rated watthour meter socket including a test switch assembly is shown in FIG. 2. The watthour meter socket includes a meter block into which the watthour meter is plugged.

Generally prior art watthour meter sockets include a cabinet 20 having a watthour meter block 40 mounted therein. Watthour meter block 40 includes meter block jaws 28 and meter block terminals 30. Watthour meter block 40 may be mounted to a back wall of the cabinet 20. A watthour meter having blades may be plugged into the watthour meter block with the watthour meter blades engaging the watthour meter block jaws. A surge ground bracket 42 is provided that includes extensions that extend away from watthour meter block 40 to facilitate positioning of the watthour meter (not shown) to cabinet 20 as well as to provide a grounding function. Wiring 29 is placed within cabinet 20 to connect meter block terminals 30 to a plurality of test switch terminals 33 on a test switch assembly 34. As shown wiring 29 is individually bent about the perimeter of cabinet 20 and connected between each respective meter block terminal 30 and the corresponding test switch assembly 34. When the cover is installed wiring 29 is shielded by the cover.

Test switch assembly 34 includes a plurality of test switches 36 which allow selective connection of a secondary testing device (not shown) to measure the accuracy of a watthour meter (not shown). Test switch 36 may include a non-conductive test switch cover 41 which prevents finger contact with the test switch assembly 34 or test switches 36.

A cover, not shown in FIG. 2, closes the front of cabinet 20 and shields the test switch 36 and wiring 29 while exposing the meter block jaws 28 through an aperture in the cover. The watthour meter is connected through aperture to connect the blades of the watthour meter to the watthour meter block jaws 28 in a male female arrangement. The construction of such watthour meter sockets can be governed by the Approved American National Standard (ANSI) and the watthour meter socket described in the prior art is compliant with current relevant ANSI standards including ANSI C12.7.

A need has arisen to provide an improved watthour meter socket.

SUMMARY

A watthour meter block is disclosed where the watthour meter block includes a housing having a profile and a lower portion. The watthour meter block includes a plurality of conductive watthour meter block jaws mounted in an interior portion of the housing. A nonconductive safety shield covers the watthour meter block, the safety shield includes a plurality of bosses, each boss including an aperture where each aperture is collinear with one of the watthour meter block jaws. A plurality of wires are also provided where each wire has a first end electrically connected to one of the watthour meter block jaws and the second end extending into the lower portion.

A connector may be provided in the lower portion to which the wire may be connected. A jumper wire may be provided for electrical connection between the watthour meter block jaws and a test switch.

DESCRIPTION OF THE PREFERRED EMBODIMENTS

The watthour meter block disclosed herein includes a non-conductive safety shield that prevents finger contact with electrically conductive components such as the jaws of a watthour meter block along with other electrically live components that may be found in a watthour meter block. The safety shield includes electrically nonconductive bosses having apertures there through that allow the blades from a watthour meter to be inserted through the bosses and into the jaws of a watthour meter block. The watthour meter block and safety shield are pre-assembled with wires that connect watthour meter block jaws with a test switch through the use of jumper wires. The wires terminate at connectors in a lower portion of the watthour meter block. Where the wires terminate at connectors in the lower portion of the watthour meter block at connectors jumper wires will be married at the connectors and then connect to a test switch.

The non-conductive safety shield provides finger safe contact when the watthour meter is removed from the watthour meter block. The term finger safe contact means that the safety shield would allow connection of the blades of a watthour meter there through to watthour meter block jaws but would not allow a user's finger to touch the conductive watthour meter block jaws.

The watthour meter block is wired to a test switch (through the use of jumper wires) mounted directly below the block which avoids the use of cumbersome jig fixtures which are used in the prior art. Further, where a customer requests the inclusion of wires having different colors, assembly of the watthour meter block may be much easier in that the entire watthour meter block may be wired from the meter jaws to the connectors in one color, for example black, and the different colored jumper wires may all be married to the connectors in the lower portion of the watthour meter block to the test switch.

Figure 1:
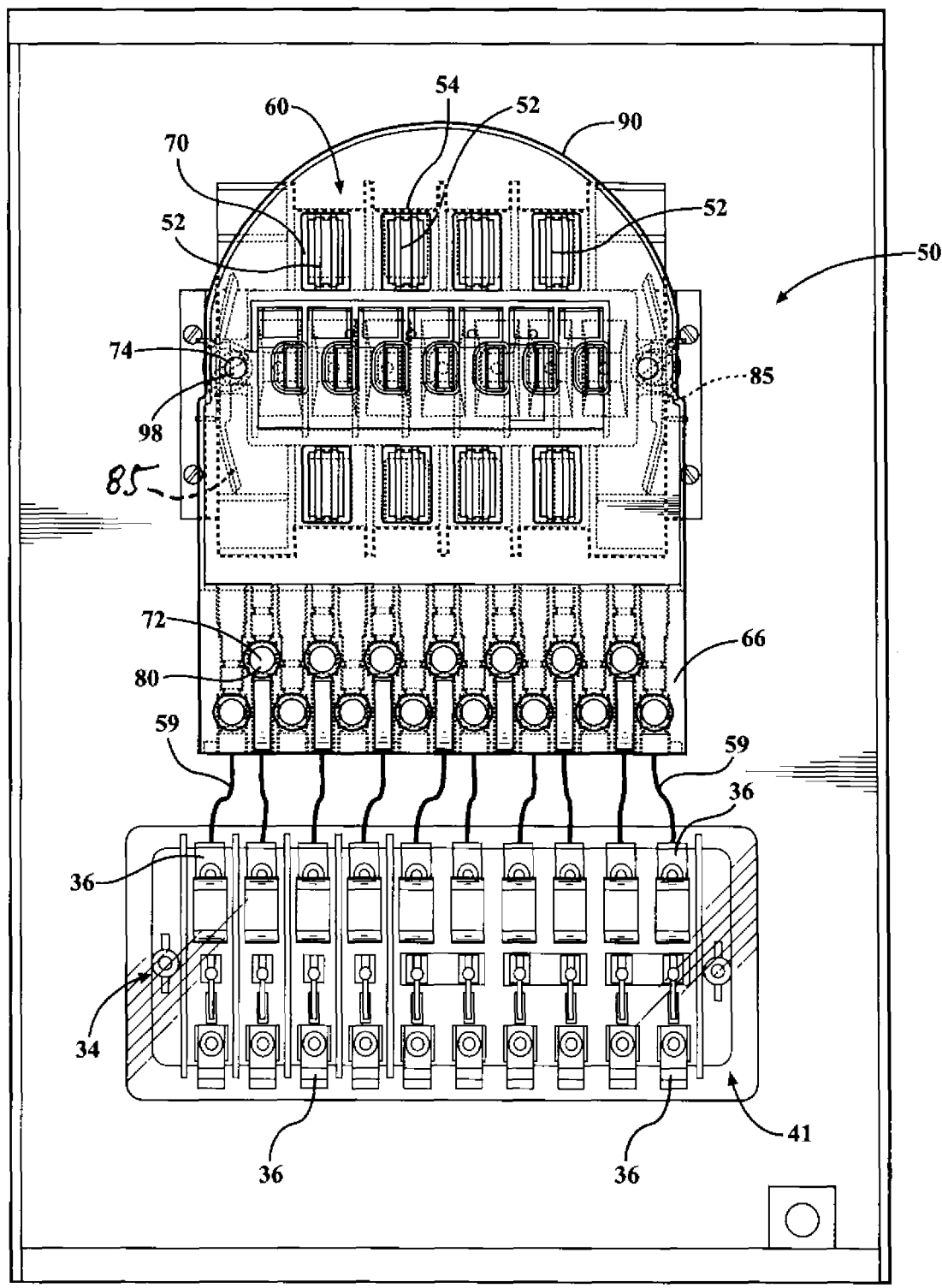
FIG. 1 is a front plan view of a meter socket cabinet with a watthour meter block with safety shield and test switch.
Figure 2:
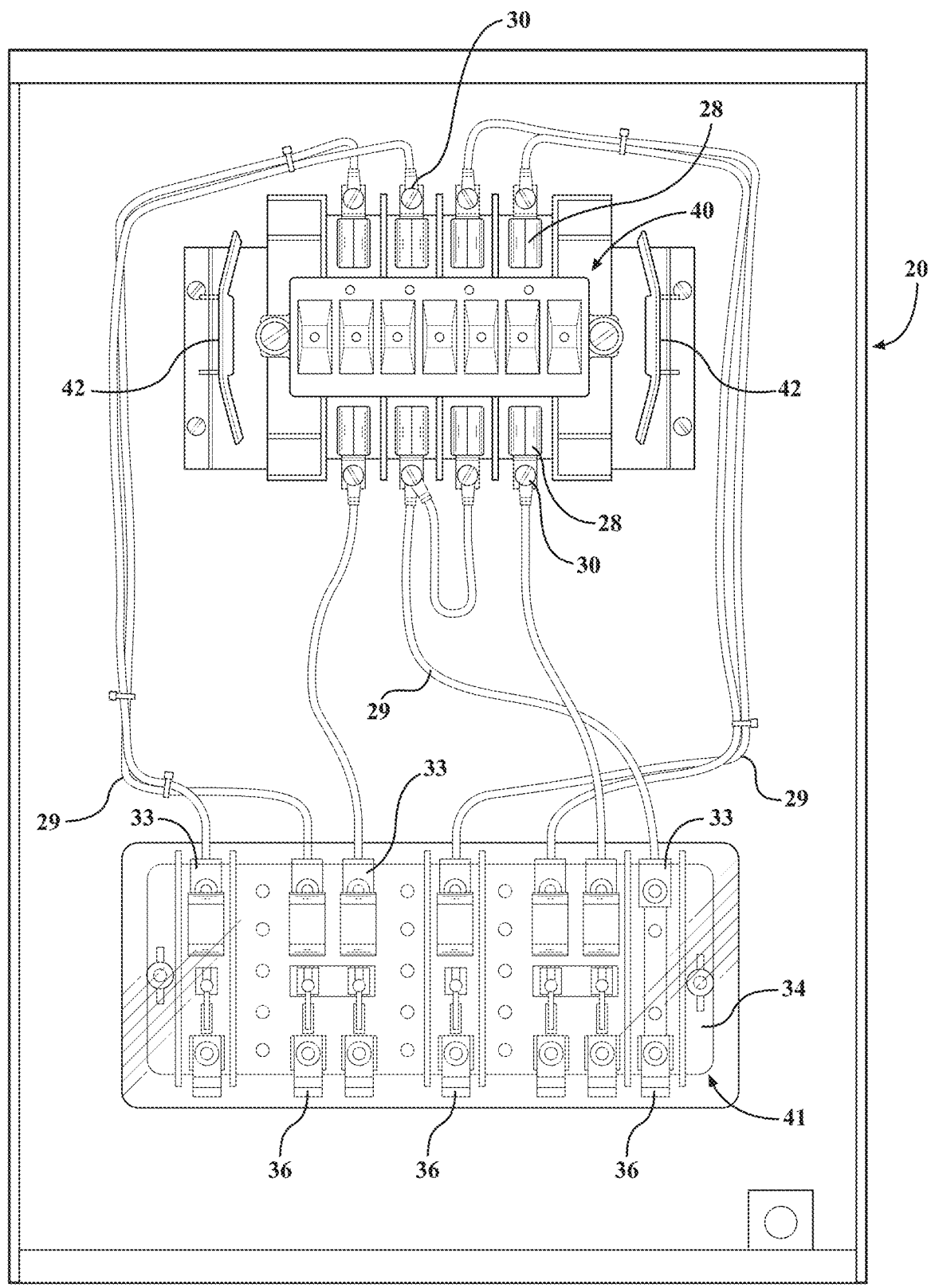
FIG. 2 is a front plan view of a prior art meter socket cabinet with a meter block and a test switch assembly.
Figure 3:
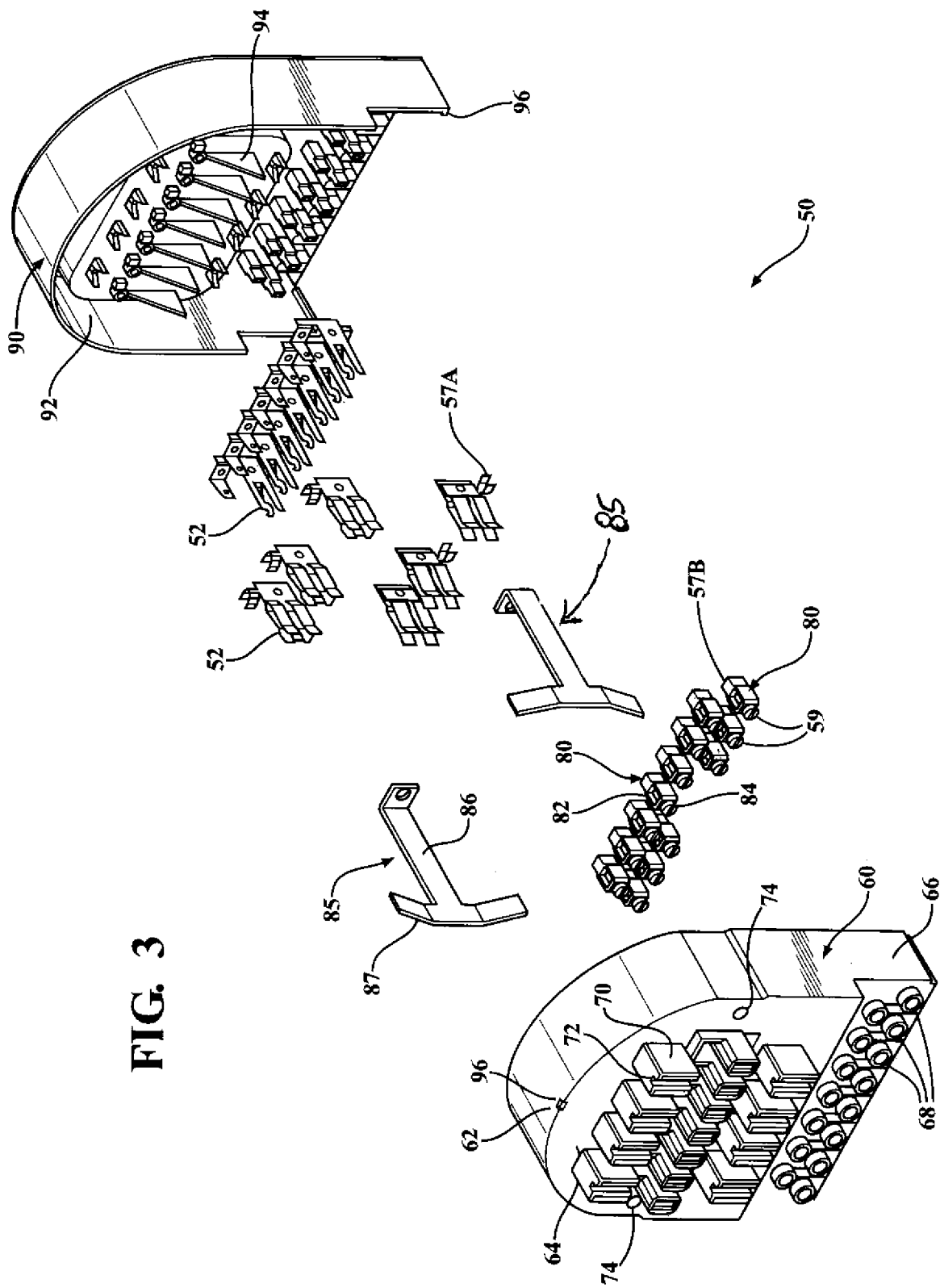
FIG. 3 is an exploded perspective view of a watthour meter block with safety shield.

With reference to the figures where like elements are numbered alike, and with particular reference to FIGS. 1 and 3 there is shown a watthour meter block 50 including watthour meter block jaws 52 and watthour meter connection points 54. Wires 56 are connected to the watthour meter block jaws 52 through the watthour meter connection points 54. Wires 56 each include a first end 57A and a second end 57B. As shown, first end 57A is electrically connected to one of the watthour meter block jaws 52 through a watthour meter connection point 54. Representative wires 56 are shown in the Figures.

A non-conductive safety shield 60 is included with the watthour meter block 50 to provide finger safe contact. Safety shield 60 includes an outer profile 62 with a front face 64 and a lower portion 66 extending in a direction downward from the front face 64. The safety shield 60 defines a hollow back and is operable to substantially cover and electrically isolate the watthour meter block jaws 52 and watthour meter connection points 54 and wires 56 from finger contact.

Figure 4:
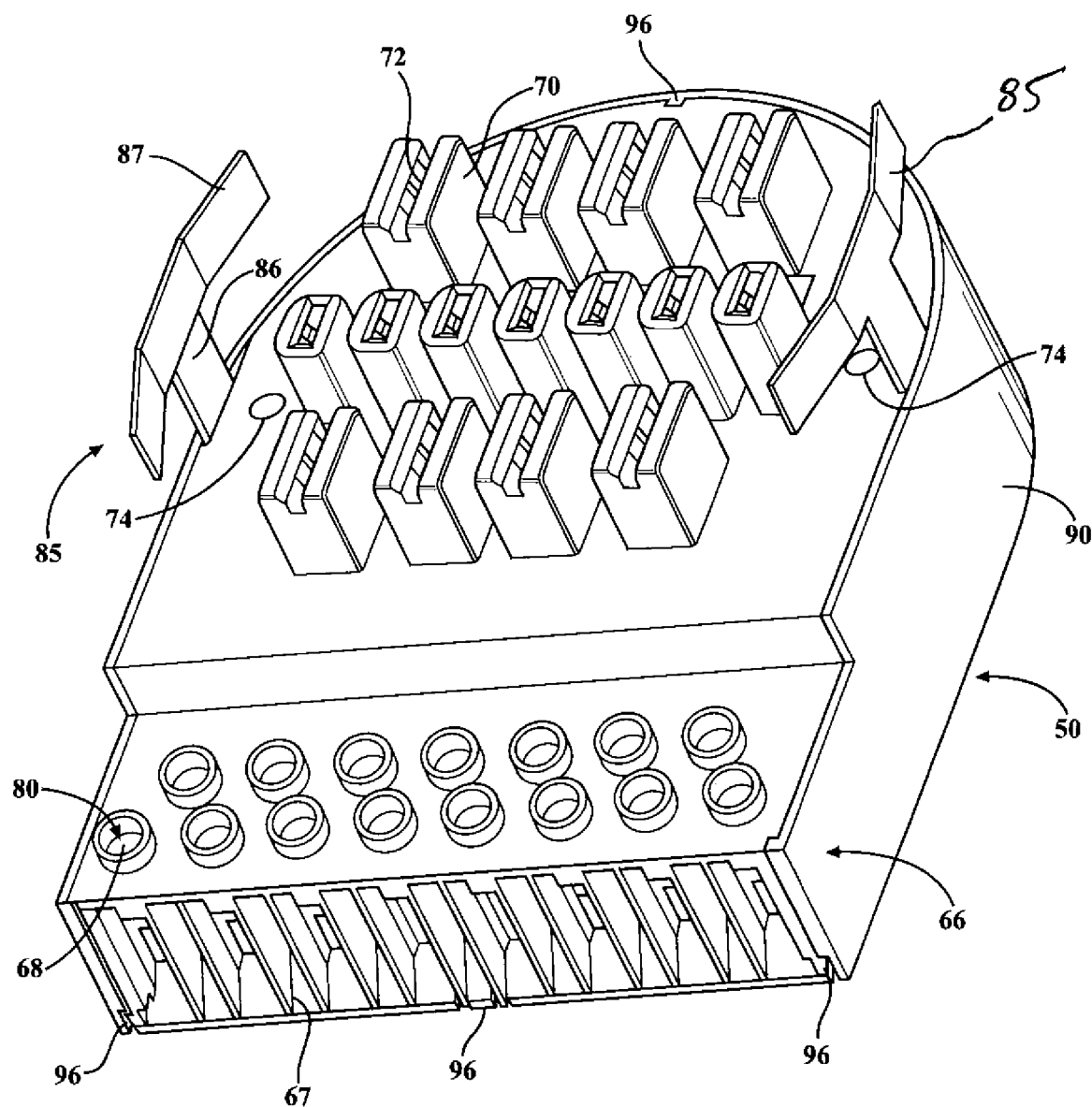
FIG. 4 is a perspective view of the watthour meter block of FIG. 3 as assembled.

As shown in FIGS. 3 and 4 safety shield 60 attaches to a housing 90. The outer profile 62 of safety shield 60 substantially matches an inner profile 92 of a watthour meter block housing 90. The safety shield 60 may be connected to the watthour meter block housing 90 with a clip in arrangement via clips 96 on the watthour meter block housing 90. Watthour meter block 50 may also include a surge ground bracket 85. Surge ground bracket 85 provides a grounding connection to the cabinet 20. Surge ground bracket 85 is made from a conductive material and each includes a leg 86 and extensions 87. Surge ground bracket 85 may facilitate positioning of a watthour meter into electrical connection with the watthour meter block 50. The surge ground bracket 85 provides voltage surge protection for the watthour meter in a manner known in the art.

With continued reference to Figures, safety shield 60 includes a lower portion 66 that extends downward from the front face 64. The lower portion may include guides 67 which locate the wires for connection to the test switch assembly 34. Lower portion 66 may also include connection apertures 68 which provide access to connectors 80. As shown, connectors 80 include an aperture 82 and a threaded fastener 84. In use, wires may be electrically connected or married by connector 80 where each wire has an electrically conductive end into the aperture 82 and the wire ends are captured by tightening the threaded fastener 84.

As noted above, one difficulty of the prior art is that each specific configuration of wires requires a unique fixture to bend the wires around the watthour meter block 40.

Occasionally due to customer demands, each unique watthour meter block jaw requires a unique color. In a first embodiment, as shown in FIG. 1 wires 56 are connected to the watthour meter block jaws 52 through watthour meter connection points 54 and are guided through the interior of the watthour meter block 50, through a plurality of guides 67 and the wires 56 connect to a connector 80 such that a jumper wire 59 can be used to connect with the test switch assembly 34. The jumper wires 59 may be of a variety of colors. The exploded view of FIG. 3 shows connectors 80. Each second end of each wire 56 can be connected to a specific connector 80. A uniquely colored jumper wire 59 may be married at the connector 80 and extend from the lower portion 66 toward the test switch assembly 34 where each color is assigned a unique test switch 36. The jumper wires may be connected and disconnected from connectors 80 by tightening or loosening the threaded fastener 84 as accessed through any of a plurality of connector apertures 68. As shown watthour meter block jaws 52 are connected to the watthour meter block housing 90 via supports 94. As shown watthour meter block safety shield 60 includes a pair of fastening apertures 74. Fastening apertures 74 receive a fastener (not shown) that extends through collinear apertures in the watthour meter block housing 90 and apertures 88 in the surge ground bracket 85.

Wiring 56 may be positioned inside the watthour meter block adjacent the outer profile 62 of the safety shield 60 behind the front face 64 such that wiring 56 does not interfere with the watthour meter block jaws 52.

As shown in the Figures safety shield 60 may include a plurality of bosses 70. In one embodiment each boss 70 extends in a direction away from front face 64. Each boss 70 corresponds with, and upon assembly, will be aligned with a watthour meter block jaw 52. Each boss 70 includes a corresponding aperture 72 which provides a conductively shielded path for a watthour meter blade (not shown) to pass there through and allow connection between the watthour meter blade and the jaws of the watthour meter block 50.

Figure 5:
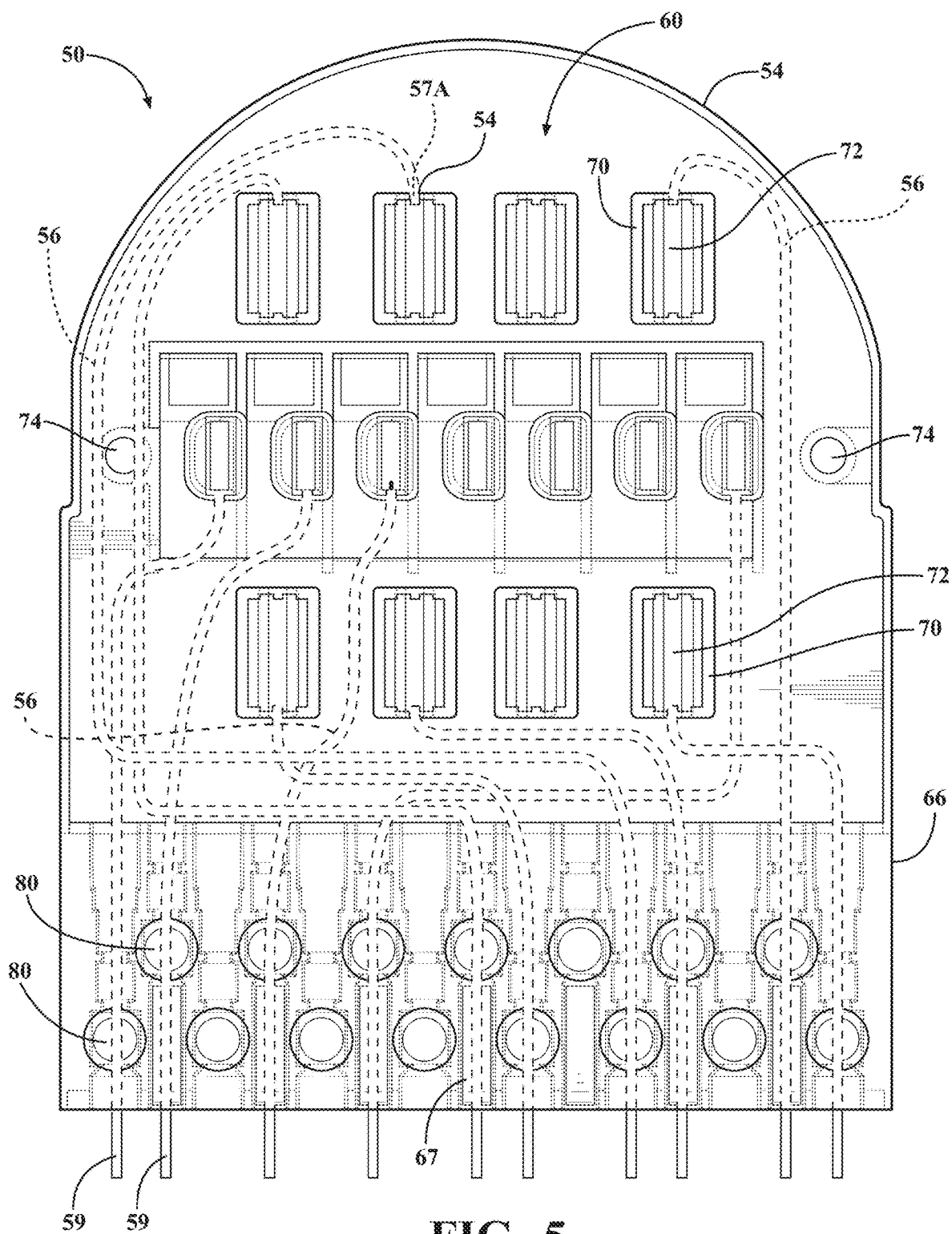
FIG. 5 is a front plan view of a pre-assembled watthour meter block with safety shield.
Figure 6:
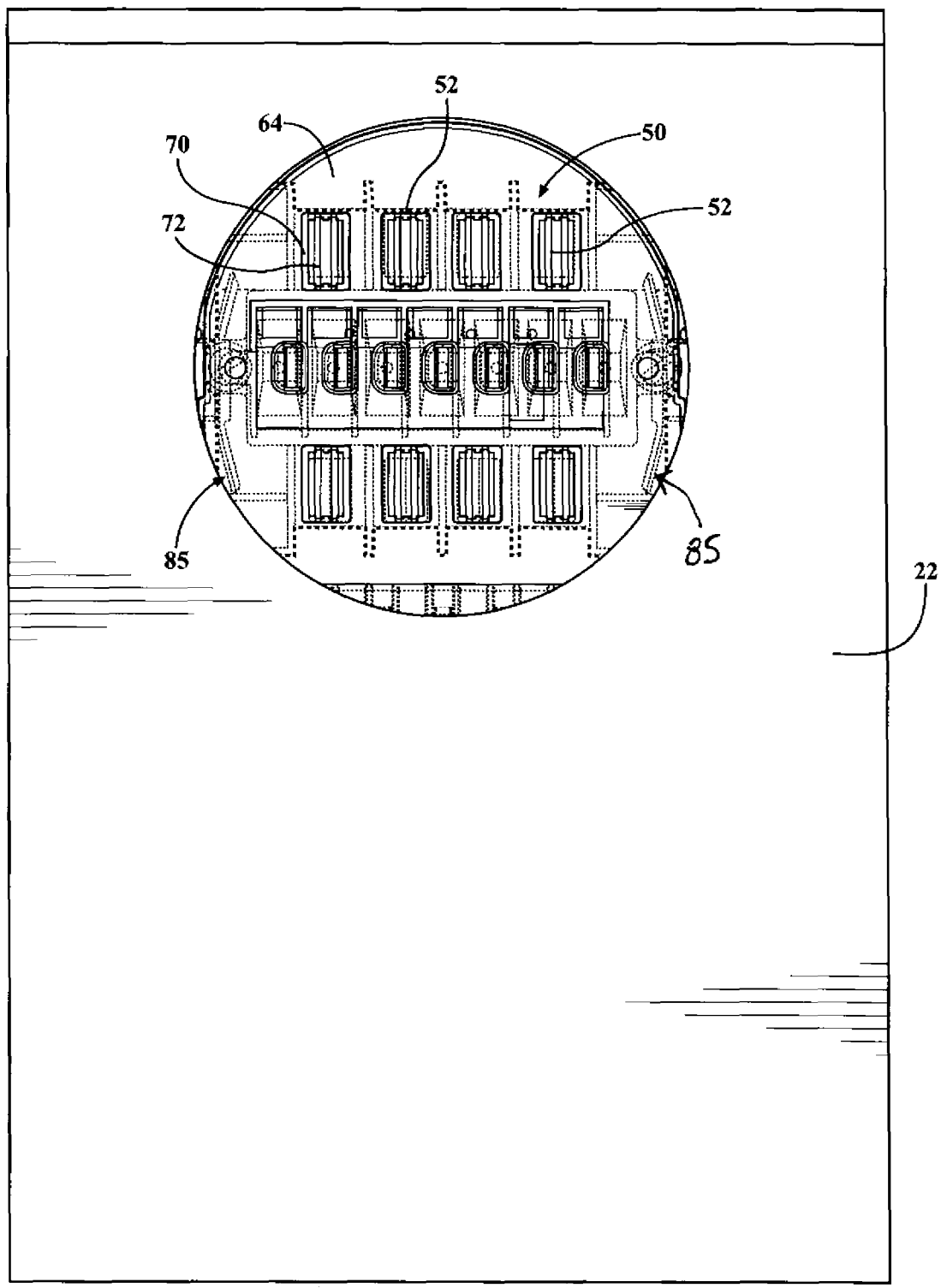
FIG. 6 is a front plan view of a watthour meter block with safety shield installed in a cabinet.

As shown in FIG. 5 a cabinet cover 22 will ultimately operate to enclose cabinet 20. Cabinet cover 22 includes an aperture 24 that allows access to watthour meter block 50. When installed cabinet cover 22 shields test switch assembly 34 from access and test switch assembly 34 cannot be operably accessed for use without removing cover 22. As shown in FIG. 5 safety shield 60 prevents finger contact with watthour meter block jaws 52 of watthour meter block 50 when the watthour meter (not shown) is removed and thus provides an added degree of safety beyond that which is required by current relevant ANSI standards including ANSI C12.7.

The wiring connecting the watthour meter block 50 and test switch assembly 34 may be colored to allow individual jaws to be connected to specific test switches. To facilitate observation of the colored wires, safety shield 50 may be made from transparent plastic.

Figure 7:
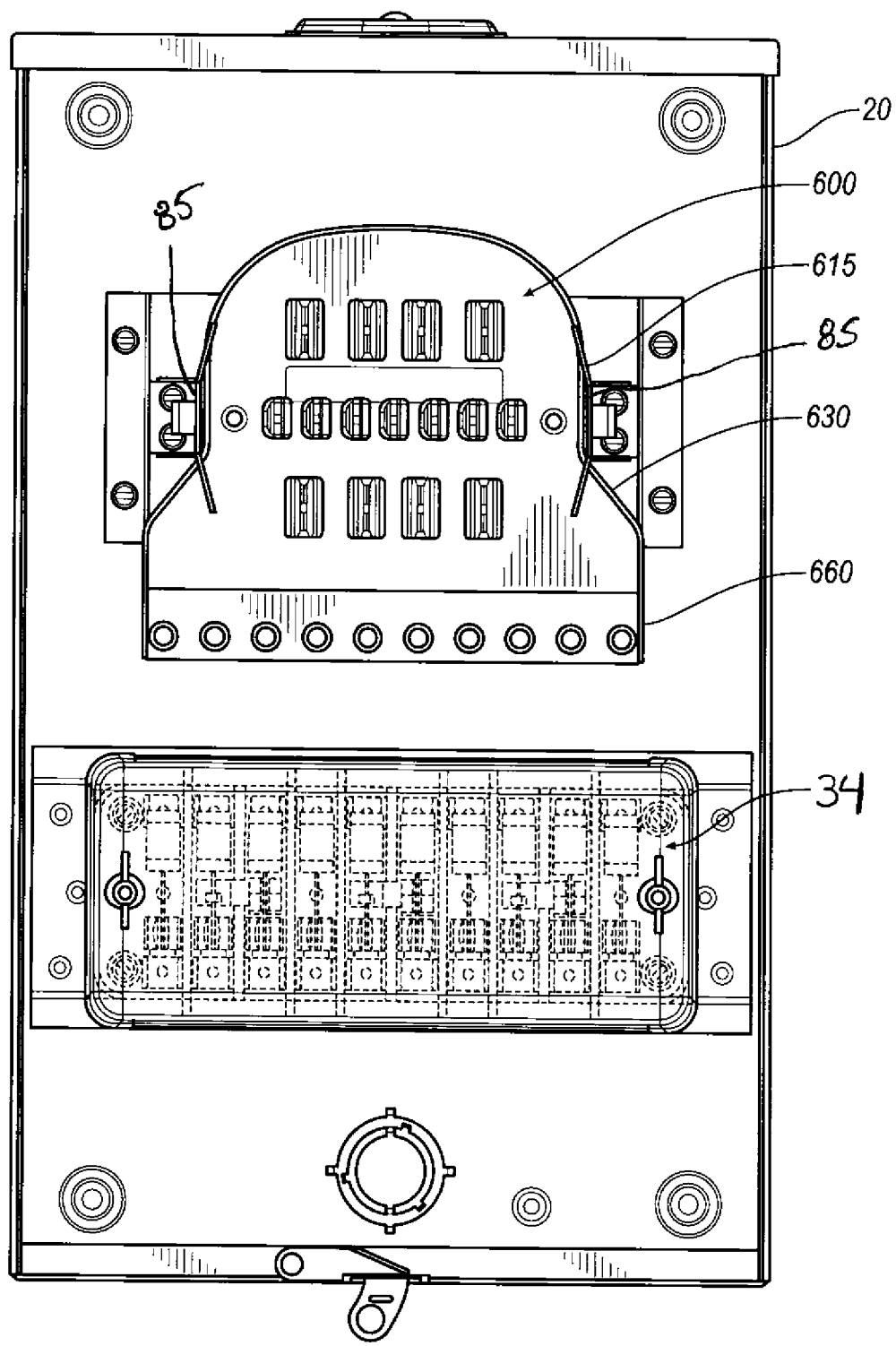
FIG. 7 is a front plan view of a meter socket cabinet with a watthour meter block with an alternate safety shield and test block.
Figure 8:
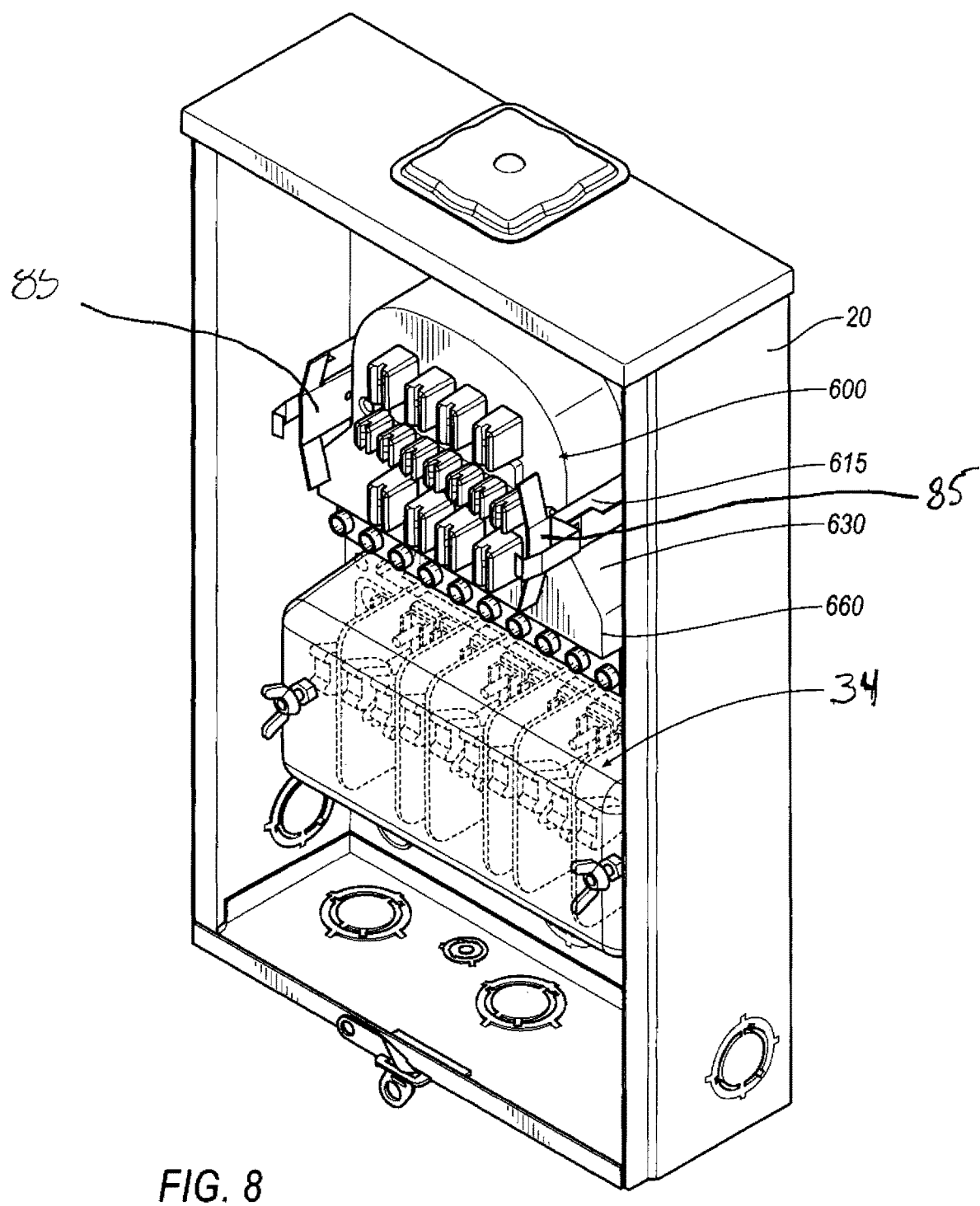
FIG. 8 is a perspective view of a meter socket cabinet with a watthour meter block and alternate safety shield and test block.

In FIGS. 7 and 8 an alternate safety shield 600 is shown. Safety shield 600 includes an upper portion 615 and a lower portion 660. An outwardly flared portion 630 separates upper portion 615 from lower portion 660. Safety shield 600 is identical to safety shield 60 in all material respects with the exception that safety shield 600 includes outwardly flared portion 630 which enables lower portion 660 to be wider than upper portion 615. Flared potion 630 provides an added benefit of improving a water shedding capability of safety shield 600 to reduce the likelihood that water falls onto test switch assembly 34. In one example, the width of lower portion 660 may be substantially the same as the width of test switch assembly 34.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A pre-wired watthour meter block with a nonconductive safety shield, the watthour meter block being housed within a cabinet, the watthour meter block comprising:
   a housing having a profile and a lower portion, the profile defining an interior portion, and the housing having supports in the interior portion;
   the housing including a plurality of conductive watthour meter block jaws mounted to the supports in an interior portion of the housing;
   the nonconductive safety shield attached to the housing, the safety shield including a plurality of bosses, each boss including an aperture where each aperture corresponds with one of the watthour meter block jaws;
   the safety shield including an outer profile having a lower portion and substantially matching the profile of the housing;
   a plurality of wires, each wire having a first end electrically connected to one of the watthour meter block jaws and a second end extending into the lower portion of the safety shield;
   a ground surge bracket extending away from the housing to beyond the safety shield; and
   a second ground surge bracket extending away from the housing to beyond the safety shield, the second ground surge bracket opposite the ground surge bracket.

2. A watthour meter block as in claim 1 further comprising a plurality of guides positioned in the lower portion of the safety shield.

3. A watthour meter block as in claim 1 wherein the safety shield is clear.

4. A watthour meter block as in claim 1 wherein the lower portion has a first width and further comprising a test switch that has a width substantially the same as the first width.

5. A watthour meter block as in claim 1 wherein the outer profile of the safety shield has an outwardly flared portion.

6. A watthour meter block as in claim 1 wherein a wall extends toward the housing at the lower portion of the safety shield by a first distance and the wall extends toward the housing above the lower portion of the safety shield by a second distance that is greater than the first distance.

7. A watthour meter block as in claim 1 wherein the safety shield includes a wall extending about the outer profile and towards the housing.

8. A watthour meter block as in claim 1 further wherein the wires attach to a connector.

9. A watthour meter block as in claim 8 including a plurality of connectors, the connectors each including an aperture and a threaded fastener, the threaded fasteners accessible through a plurality of connection apertures in the safety shield.

10. A watthour meter block as in claim 9 wherein the wires terminate at the connectors.

11. A watthour meter block as in claim 10 further including a plurality of jumper wires with one jumper wire connected to one connector.

12. A watthour meter block as in claim 11 wherein the wires are all of different colors.

13. A watthour meter block as in claim 11 further wherein the wires are all of one color.

14. A watthour meter block as in claim 13 wherein the jumper wires are at least 2 different colors.

15. A pre-wired watthour meter block with a nonconductive safety shield, the watthour meter block being housed within a cabinet, the watthour meter block comprising:
   a housing having a profile and a lower portion, the profile defining an interior portion, and the housing having supports in the interior portion;
   the housing including a plurality of conductive watthour meter block jaws mounted to the supports in an interior portion of the housing;
   the nonconductive safety shield attached to the housing, the safety shield including a plurality of bosses, each boss including an aperture where each aperture corresponds with one of the watthour meter block jaws;
   the safety shield including an outer profile having a lower portion and substantially matching the profile of the housing;
   a plurality of wires, each wire having a first end electrically connected to one of the watthour meter block jaws and a second end extending into the lower portion of the safety shield; and
   a ground surge bracket elongated away from the housing to beyond the safety shield.

16. A watthour meter block as in claim 15 wherein the ground surge bracket is between the profile of the housing and the outer profile of the safety shield.

17. A watthour meter block as in claim 15 further comprising a second ground surge bracket extending away from the housing to beyond the safety shield, the second ground surge bracket opposite the ground surge bracket.

18. A watthour meter block as in claim 15 wherein the ground surge bracket includes a leg and an extension extending from the leg and spaced from the housing and the safety shield.

19. A watthour meter block as in claim 18 wherein the ground surge bracket includes a second extension, and wherein the leg, the second leg and the extension, and the second extension form a T-shape are T shaped.

20. A watthour meter block as in claim 18 wherein the leg is perpendicular to the extension.

* * * * *

UNITED STATES PATENT AND TRADEMARK OFFICE
CERTIFICATE OF CORRECTION

PATENT NO. : 10,620,242 B2
APPLICATION NO. : 15/864210
DATED : April 14, 2020
INVENTOR(S) : Justin A. Olson et al.

Page 1 of 1

It is certified that error appears in the above-identified patent and that said Letters Patent is hereby corrected as shown below:

In the Claims

Column 6, in Lines 62-63, replace "wherein the leg, the second leg and the extension, and the second extension form a T-shape are T shaped" with -- wherein the leg, the extension, and the second extension form a T-shape. --.

Signed and Sealed this
Seventeenth Day of November, 2020

Andrei Iancu
*Director of the United States Patent and Trademark Office*